US012771379B2

(12) United States Patent

Schaefer

(10) Patent No.: US 12,771,379 B2
(45) Date of Patent: Oct. 20, 2026

(54) SYNDROME CHECK FUNCTIONALITY TO DIFFERENTIATE BETWEEN ERROR TYPES

(71) Applicant: Micron Technology, Inc., Boise, ID (US)

(72) Inventor: Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 18/804,539

(22) Filed: Aug. 14, 2024

(65) Prior Publication Data

US 2025/0047304 A1 Feb. 6, 2025

Related U.S. Application Data

(63) Continuation of application No. 18/098,995, filed on Jan. 19, 2023, now Pat. No. 12,081,235.

(60) Provisional application No. 63/301,320, filed on Jan. 20, 2022.

(51) Int. Cl.
*H03M 13/11* (2006.01)
*H03M 13/00* (2006.01)
*H03M 13/43* (2006.01)

(52) U.S. Cl.
CPC ........ *H03M 13/1111* (2013.01); *H03M 13/43* (2013.01); *H03M 13/611* (2013.01)

(58) Field of Classification Search
CPC ......................... H03M 13/1111; H03M 13/43; H03M 13/611; H03M 13/13; G06F 11/10; G06F 11/1048
See application file for complete search history.

(56) References Cited

U.S. PATENT DOCUMENTS

| | | | | |
|---|---|---|---|---|
| 6,834,022 | B2 * | 12/2004 | Derner | G11C 11/40622 365/222 |
| 9,337,872 | B2 | 5/2016 | Perego | |
| 9,817,714 | B2 | 11/2017 | Halbert et al. | |
| 10,803,972 | B2 | 10/2020 | Suzuki et al. | |
| 10,936,391 | B2 | 3/2021 | Hsiao | |
| 2009/0249169 | A1 * | 10/2009 | Bains | G06F 11/106 714/766 |
| 2016/0011930 | A1 | 1/2016 | Yeh | |
| 2017/0063394 | A1 | 3/2017 | Halbert et al. | |
| 2019/0129776 | A1 | 5/2019 | Hsiao | |
| 2020/0264950 | A1 | 8/2020 | Schaefer et al. | |
| 2021/0105346 | A1 | 4/2021 | Pandey | |

(Continued)

*Primary Examiner* — Thien Nguyen
(74) *Attorney, Agent, or Firm* — Holland & Hart LLP

(57) ABSTRACT

Methods, systems, and devices for syndrome check functionality to differentiate between error types are described. A host system, a memory system, or some combination of both may include syndrome check circuitry to provide enhanced error diagnostic capabilities for data communicated between the host system and the memory system. The syndrome check circuitry may receive a first signal from the memory system indicating whether the memory system detected and attempted to correct an error in the data and may receive a second signal from the host system indicating whether the host system detected an error in the received data. The syndrome check circuitry may compare the first signal and the second signal using a set of logic gates to differentiate between different combinations of errors detected at one or both of the memory system or the host system.

20 Claims, 8 Drawing Sheets

(56) References Cited

U.S. PATENT DOCUMENTS

| | | | |
|---|---|---|---|
| 2022/0012128 | A1 | 1/2022 | Lee et al. |
| 2022/0075532 | A1 | 3/2022 | Schaefer |
| 2023/0231574 | A1 | 7/2023 | Schaefer |
| 2023/0377673 | A1 | 11/2023 | Jang |

* cited by examiner

SYNDROME CHECK FUNCTIONALITY TO DIFFERENTIATE BETWEEN ERROR TYPES

CROSS REFERENCE

The present application for patent is a continuation of U.S. patent application Ser. No. 18/098,995 by Schaefer, entitled "SYNDROME CHECK FUNCTIONALITY TO DIFFERENTIATE BETWEEN ERROR TYPES," filed Jan. 19, 2023, which claims priority to and the benefit of U.S. Provisional Patent Application No. 63/301,320 by Schaefer, entitled "SYNDROME CHECK FUNCTIONALITY TO DIFFERENTIATE BETWEEN ERROR TYPES," filed Jan. 20, 2022, each of which is assigned to the assignee hereof, and each of which is expressly incorporated by reference in its entirety herein.

FIELD OF TECHNOLOGY

The following relates generally to one or more systems for memory and more specifically to syndrome check functionality to differentiate between error types.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., flash memory, may maintain their stored logic state for extended periods of time even in the absence of an external power source. Volatile memory devices, e.g., DRAM, may lose their stored state when disconnected from an external power source.

DETAILED DESCRIPTION

Figure 1:
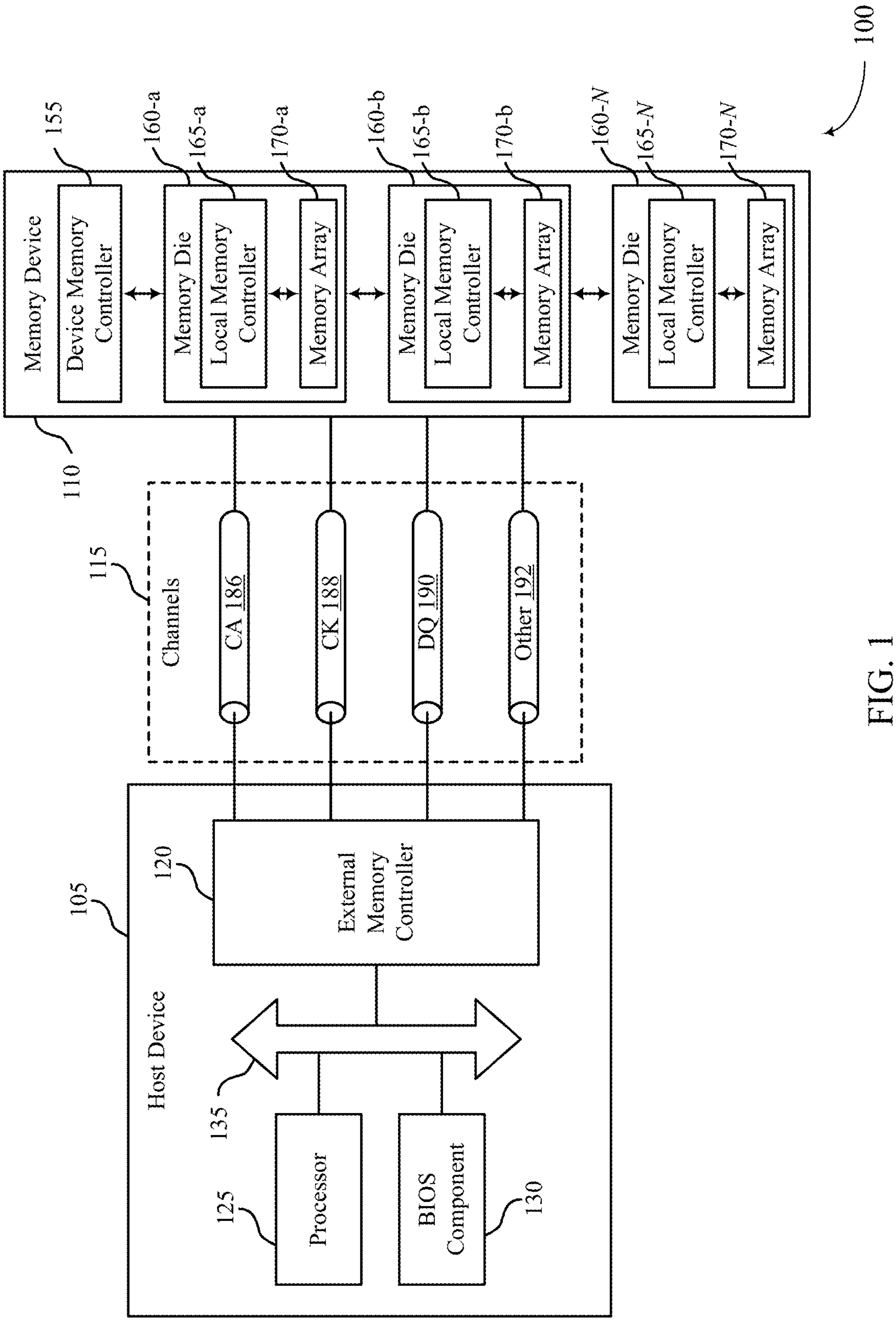
FIG. 1 illustrates an example of a system that supports syndrome check functionality to differentiate between error types in accordance with examples as disclosed herein.

Some memory systems may operate under various conditions as part of electronic apparatuses such as personal computers, wireless communication devices, automobiles, etc. Memory systems supporting applications for some implementations (e.g., automotive vehicles) may be based on (e.g., subject to) increased reliability constraints. As such, memory systems (e.g., systems including DRAM) for some applications may be expected to operate with a reliability subject to relatively higher industry standards or specifications (e.g., higher reliability constraints). In some cases, memory systems may use error control techniques, such as error correction, error detection, or both to increase the reliability of stored data. In some examples, an external device or system that stores data in a memory system, such as a host device or host system, may also use error control techniques to confirm the reliability of received data. Error control techniques may include techniques to detect single-bit errors (SBEs), single error correction (SEC) techniques, techniques to detect double-bit errors (DBEs) such as double error detection (DED) techniques, and single error correction double error detection (SECDED) techniques. In some cases, the error control techniques implemented at a memory system may differ from the error control techniques implemented at a host system. In some cases, if errors in a set of data read from the memory system are more numerous than an on-die error-correcting code (ECC) scheme of the memory system may properly handle (e.g., detect, correct), the on-die ECC scheme may introduce additional errors, which may in turn result in a higher quantity of errors than an ECC scheme of the host can properly handle. Accordingly, the ECC scheme of the host system may in turn introduce further errors into the set of data. In some examples, a memory system and host system may include syndrome check circuitry to improve reliability of the system. The syndrome check circuitry may detect whether both the memory system and the host system detect an error, and the host system may take subsequent action based on the detection. However, the syndrome check circuitry may not be configured to differentiate between different combinations of errors detected at the memory system and the host system. For example, the syndrome check circuitry may not be configured to determine whether the memory system detected an error and the host system did not detect an error, whether the memory system did not detect an error and the host system detected an error, or whether the memory system detected an error and the host system detected an error, or various combinations. Accordingly, techniques to improve diagnostic information of syndrome check circuitry are desired.

As described herein, a host system, a memory system, or both may use syndrome check circuitry which may be configured to increase the reliability of data transfers between the memory system and the host system and to improve error diagnostic capabilities, among other advantages. In some examples, the syndrome check circuitry may be configured to distinguish between different combinations of errors detected by the memory system and the host system. The syndrome check circuitry may be included in one or both of the host system or in the memory system. Additionally or alternatively, the syndrome check circuitry may be an independent device or component separate from one or both of the host system or the memory system. In some cases, the syndrome check circuitry may include additional circuitry, such as a set of logic gates (e.g., AND gates) and a set of inverters, to improve diagnostic information. For example, during an access operation for data stored in the memory system, the syndrome check circuitry may receive a first signal from the memory system indicating whether the memory system detected and attempted to correct an error in the data and a second signal from the host system indicating whether the host system detected an error in the received data. The syndrome check circuitry may determine characteristics of (e.g., compare) the first signal and the second signal using the additional circuitry to differentiate between different combinations of errors detected at the memory system and the host system. For example, the additional circuitry may be configured to determine whether the memory system detected an error and the host system did not detect an error, whether the memory system did not detect an error and the host system detected an error, whether both the memory system and the host system detected an error, or whether neither the memory system nor the host system detected an error, or various combinations thereof. Accordingly, the syndrome check circuitry may support improved diagnostic capabilities, for example by allowing four distinct error states to be detected, rather than a syndrome check circuit configured to detect either the host system or the memory system detected an error, or whether neither the memory system nor the host system detected an error (e.g., two error states). In some case, the host system, the memory system, or both may use the improved diagnostic information to further improve reliability of data communicated between the host system and the memory system, among other advantages.

Features of the disclosure are initially described in the context of systems and dies as described with reference to FIGS. 1 and 2. Features of the disclosure are described in the context of a system and a process flow as described with reference to FIGS. 3-4. These and other features of the disclosure are further illustrated by and described with reference to an apparatus diagram and flowcharts that relate to syndrome check functionality to differentiate between error types as described with reference to FIGS. 5-8.

FIG. 1 illustrates an example of a system 100 that supports syndrome check functionality to differentiate between error types in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller (e.g., vehicle logic), or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller (e.g., logic), a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, a host device 105 and a memory device 110, such as a DRAM device, may use error control techniques, such as error correction, error detection, or both to increase the reliability of stored data, for example data stored in a memory array 170. In some examples, the host device 105 and the memory device 110 may include syndrome check circuitry to improve reliability of the system. The syndrome check circuitry may detect whether both the host device 105 and the memory device 110 detected an error in data, and the host device 105 or the memory device 110 may take subsequent action based on the detection. However, the syndrome check circuitry may not be configured to differentiate between different combinations of errors detected at the host device 105 and the memory device 110. For example, the syndrome check circuitry may not be configured to determine whether the memory device 110 detected an error and the host device 105 did not detect an error, whether the memory device 110 did not detect an error and the host device 105 detected an error, or whether the memory device 110 detected an error and the host device 105 detected an error.

In some examples, the host device 105 and the memory device 110, use syndrome check circuitry which may be configured to increase the reliability of data transfers between the host device 105 and the memory device 110 and to improve error diagnostic capabilities. In some examples, the syndrome check circuitry may be configured to determine (e.g., distinguish between) different combinations of errors detected by the host device 105 and the memory device 110. The syndrome check circuitry may be included in the host device 105 or in the memory device 110 or both. Additionally or alternatively, the syndrome check circuitry may be an independent device or component. For example, during an access operation for data stored in the memory device 110, the syndrome check circuitry may receive a first signal from the memory device 110 indicating whether the memory device 110 detected and attempted to correct an error in the data and a second signal from the host device 105 indicating whether the host device 105 detected an error in the received data. The syndrome check circuitry may compare the first signal and the second signal using the additional circuitry to differentiate between different combinations of errors detected at the memory device 110 and the host device 105.

Figure 2:
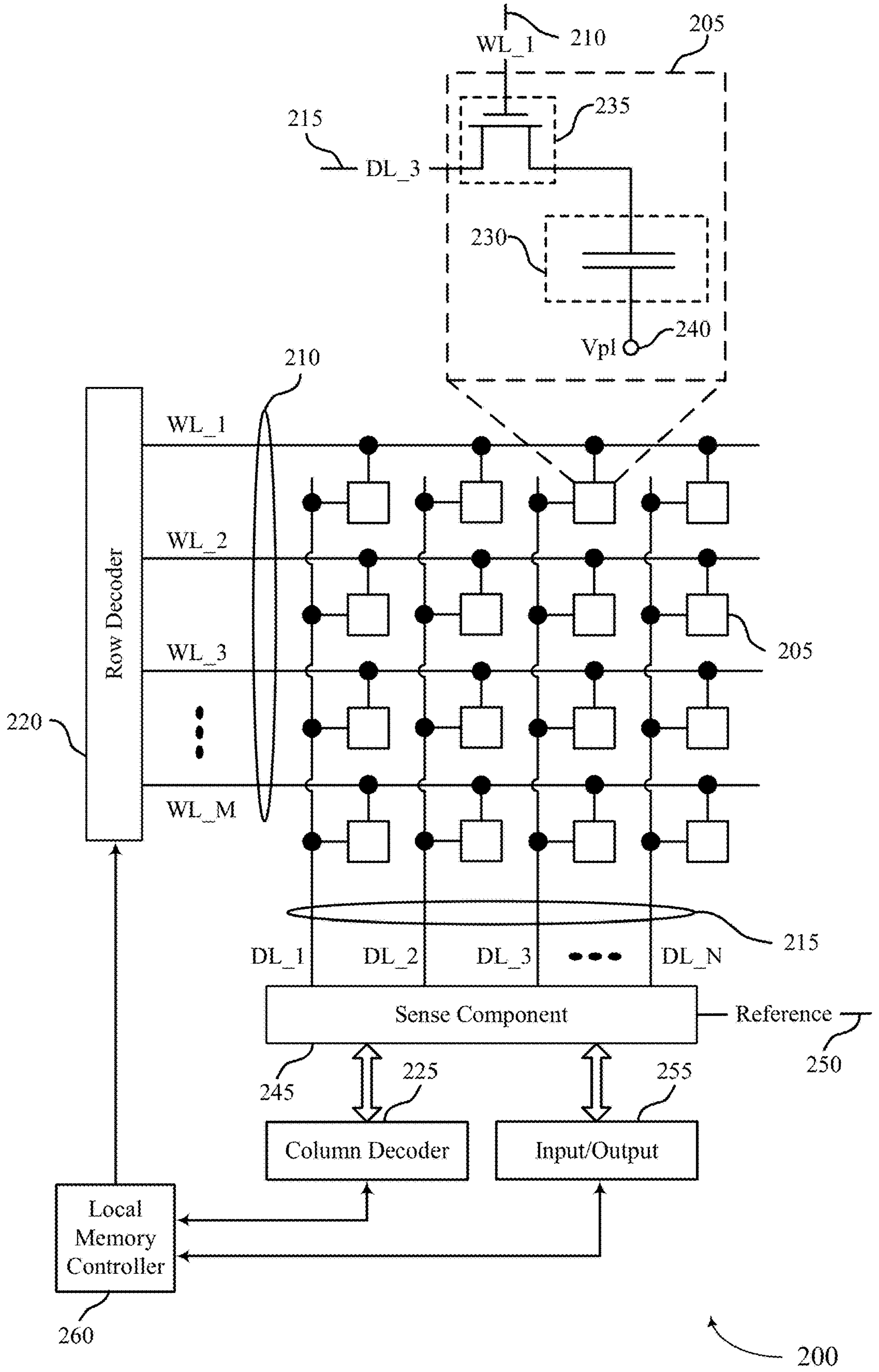
FIG. 2 illustrates an example of a memory die that supports syndrome check functionality to differentiate between error types in accordance with examples as disclosed herein.

FIG. 2 illustrates an example of a memory die 200 that supports syndrome check functionality to differentiate between error types in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 (e.g., logic) and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples the memory die may include an error control circuit, such as an on-die ECC circuit, to perform an error control procedure. For example, the error control circuit may be included in the local memory controller 260. An error control circuit may be configured to detect errors, correct errors, or both for data stored in one or more target memory cells 205. For example, as part of a write operation to store data in the memory die 200, the error control circuit may perform an error control procedure to generate a first set of error control bits, such as an error control code or a syndrome. Subsequently (e.g., if the memory die 200 receives a read command for the data), the error control circuit may generate a second set of error control bits for the data using the error control procedure, and determine one or more parameters related to (e.g., compare) the first set of error control bits with the second set of error control bits.

In some cases, if the first set of error control bits match the second set of error control bits, the error control circuit may generate an output indicating that no error was detected in the data. Additionally or alternatively, if the first set of error control bits do not match (e.g., are different than) the second set of error control bits, the error control circuit may determine that an error was detected in the data. Accordingly, the error control circuit may generate an output indicating that an error was detected. In some cases, the error control circuit may attempt to correct the error, for example using an SEC technique. If the data contained an SBE, the SEC technique may correct error. Thus, a subsequent check of the data, for example performed by a host device after the data has been transmitted to the host device, may not detect an error in the data.

However, if the data contained an MBE, the SEC technique may, in some examples, introduce additional errors into the data (e.g., through aliasing) instead of correcting an error. Accordingly, a subsequent check of the data may still detect an error on the data. Thus, techniques to indicate whether a memory device detected an error in data, whether a host device detected an error in the data, or both as described herein may increase diagnostic capability and reliability of data by providing additional information on errors detected in data, such as indicating whether an error is detected after and error correction procedure was attempted, which may, in some examples, suggest that the data contained a MBE.

Figure 3:
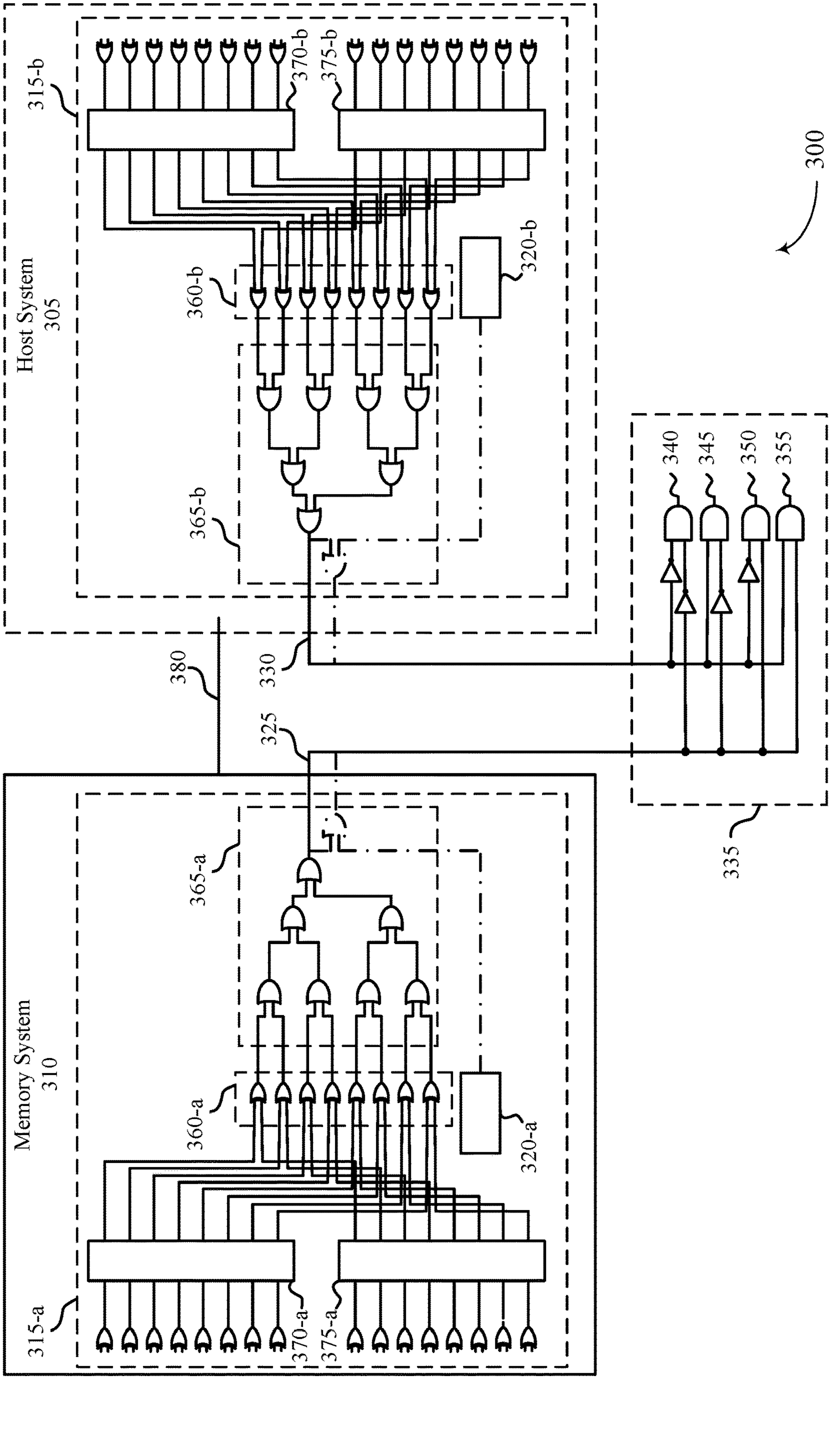
FIG. 3 illustrates an example of a system that supports syndrome check functionality to differentiate between error types in accordance with examples as disclosed herein.

FIG. 3 illustrates an example of a system 300 that supports syndrome check functionality to differentiate between error types in accordance with examples as disclosed herein. The system 300 may be configured to determine and indicate whether a host system 305, a memory system 310, or both detected an error associated with data stored in a memory array of the memory system 310 (e.g., an error in the data, or an error in parity bits associated with the data), for example using an on-die ECC component, such as an error control circuit 315. In some examples, the error control circuit 315 may be included in the host system 305, in the memory system 310, or both. For example, the memory system 310 may include an error control circuit 315-*a* and the host system 305 may include an error control circuit 315-*b*.

In some cases, the error control circuit 315 may be configured to detect errors in data stored in a memory cell of the memory system 310, or data communicated between the host system 305 and the memory system 310, or both. Error control circuit 315 may also be configured to correct errors in data by flipping a data bit that has been identified as being corrupted—e.g., changing a corrupted data bit from a "1" to a "0," or vice versa. In some cases, error control circuit 315 may be configured to detect single-bit errors (SBEs) in data and to correct SBEs in data.

For example, error control circuit 315 may be configured to use a SEC technique. In other cases, error control circuit 315 may be configured to detect DBEs and to correct SBEs in requested data (e.g., error control circuit 315 may be configured to use a SECDED technique). In such cases, the error control circuit 315 may include a DED component 320 configured to output an indication of whether a DBE or another even bit error (e.g., a four-bit error, a six-bit error) was detected. Additionally, the error control circuit 315 may include circuitry to perform a procedure for DED. In some cases, the DED component 320 may be an example of an even/odd bit detection bit. Accordingly, the DED component 320 may include a first state (e.g., a high state, a logic "1" state) if an even quantity of bit errors are detected in data, and may include a second state (e.g., a low state, a logic "0" state) if an odd quantity of bit errors (e.g., one error, three errors) are detected in the data. In some cases, the error control circuit 315 may be configured to detect up to any first quantity of errors and correct up to any second quantity of errors (that may be different than or the same as the first quantity). Error control circuit 315 may be further configured to provide altered data (e.g., data that has been "corrected") to an external device.

In some cases, the error control circuit 315 may generate an output indicating whether the error control circuit 315 detected an error in the data, or whether the error control circuit 315 detected and attempted to correct an error in the data, or both. For example, if the error control circuit 315 is included in the memory system 310, the output of the error control circuit 315 may be a first value (e.g., a high voltage, a logical "1") if the error control circuit 315 detected an error in the data or attempted to correct an error in that data. Alternatively, the output of the error control circuit 315 may be a second value (e.g., a low voltage or logical "0") if the error control circuit 315 did not detect an error in the data (e.g., if the data did not contain an error or if the data contained an undetectable error, such as an MBE is the error control circuit does not include the DED component 320).

By way of example, the host system 305 and the memory system 310 may communicate data, such as data included in an access operation. As part of performing the access operation, the memory system 310 may generate a parity or error control code for the data and compare the generated error control code with a stored error control code for the data (e.g., an error control code for the data generated during an initial write operation for the data). In some cases, the generated error control code, the stored error control code, or both may be examples of syndromes (e.g., syndrome information), and may each include a plurality of syndrome bits. Using the error control circuit 315 included in the memory system 310, the memory system 310 may attempt to detect and, in some case, correct one or more errors in the data. The memory system 310 may then transmit the data and a first output 325 (e.g., the output of the error control circuit 315, which may be a high value if an error was detected or a low value if no error was detected) to the host system 305 (e.g., directly via output 380 or through another system component) or to a syndrome check circuit 335.

The host system 305 may receive the data and, in some cases, the first output 325, from the memory system 310. The host system 305 may generate an error control code 370 for the data and compare the generated error control code 370 with the stored error control code 375 for the data (e.g., an error control code for the data generated during an initial write operation for the data). In some cases, the generated error control code 370, the stored error control code 375, or both may be examples of syndromes (e.g., syndrome information), and may include each include a plurality of syndrome bits. Using the error control circuit 315 included in the host system 305, the host system 305 may attempt to detect an error in the data and generate a second output 330 indicating whether an error was detected in the data to the syndrome check circuit 335.

In some cases, the error control circuit 315 may include one or more sets of logic components, such as logic gates, to detect an error in the data. For example, the error control circuit may include a first set of logic gates 360, which may be an example of a set of exclusive-OR gates, to compare the generated error control code 370 with the stored error control code 375. In some cases, the error control circuit 315 may include a second set of logic gates 365, which may be an example of a set of OR gates. The second set of logic gates 365 may be coupled with the first set of logic gates 360, and may be configured to compare the output of the first set of logic gates 360 to generate the first output 325. For example, the second set of logic gates 365 may generate a high output if at least one pair of bits of the generated error control code 370 and the stored error control code 375 differ (e.g., if at least one logic gate of the first set of logic gates 360 output a high value), and may generate a low output if each pair of bits of the generated error control code 370 and the stored error control code 375 match.

In some examples, the syndrome check circuit 335 may receive the first output 325 from the memory system 310 and the second output 330 from the host system 305. The syndrome check may include a set of logical gates (e.g., AND gates) an inverters to indicate a diagnostic state of the first output 325 and the second output 330. For example, the syndrome check circuit 335 may configured to output a first data condition 340 to indicate that both the first output 325 and the second output 330 are low (e.g., a "low-low" state), which may include inverting (among other examples) the first output 325 and the second output 330, a second data condition 345 to indicate that the first output 325 is low and the second output 330 is high (e.g., a "low-high" state), which may include inverting (among other examples) the first output 325, a third data condition 350 to indicate that the first output 325 is high and the second output 330 is low (e.g., a "high-low" state), which may include inverting (among other examples) the second output 330, or a fourth data condition 355 to indicate that both the first output 325 and the second output 330 are high (e.g., a "high-high" state).

In some cases, the output of the syndrome check circuit 335 may be transmitted to or stored at the memory system 310, the host system 305, or both. Additionally or alternatively, the output of the syndrome check circuit 335 may be stored at the syndrome check circuit, such as at a buffer or register in the syndrome check circuit 335, and may be checked or polled by the host system 305 or the memory system 310 or both. In some cases, the host system 305 or the memory system 310 may use the output of the syndrome check circuit 335 to determine whether to perform an error correction procedure. For example, if the host system 305 is operating in a correction mode, the host system 305 may determine to perform an error correction procedure if the output of the syndrome check circuit 335 indicates that the host system 305 detected an error.

In some cases, the output of the syndrome check circuit 335 may be the first data condition 340 (e.g., the "low-low" state). In such cases, the host system 305, the memory system 310, or both may determine that the data transmitted from the memory system 310 to the host system 305 is good (e.g., "prime") data. Accordingly, the host system 305 may use the data, for example as part of executing a program or other operation which requested the data from the memory system 310. Additionally or alternatively, the host system 305, the memory system 310, or both may refrain from performing an error correction procedure on the data.

In some cases, the output of the syndrome check circuit 335 may be a second data condition 345 (e.g., the "high-low" state). In such cases, the host system 305, the memory system 310, or both may determine that the memory system 310 detected and attempted to correct an error in data, while the host system 305 did not detect an error in the data. Accordingly, the host system 305, the memory system 310, or both may determine that there was a SBE in the data stored in the memory system 310, but that the memory system 310 corrected the error. Thus, the host system 305 may use the data, for example as part of executing a program or other operation which requested the data from the memory system 310.

In some cases, the second data condition 345 may indicate that a latent error exists in the memory system 310. For example, the latent error may be a fault or defective memory cell. Accordingly, the host system 305, the memory system 310, or both may mask out or otherwise mark a row of memory cells containing the latent error. For example, the memory system 310 may transfer data stored in a row or page which includes the latent error to a separate row or page. Thus, the memory system 310 may correct or avoid the latent error in subsequent access operations. Additionally or alternatively, the host system 305, the memory system 310, or both may refrain from performing an additional error correction procedure on the data.

In some cases, the output of the syndrome check circuit 335 may be the third data condition 350 (e.g., the "low-high" state). In such cases, the host system 305, the memory system 310, or both may determine that the memory system 310 did not detect an error in data, while the host system 305 did detect an error in the data. Accordingly, the host system 305, the memory system 310, or both may determine that there was an MBE, such as a DBE in the data stored in the memory system 310 which the error control circuit 315 of the memory system 310 was unable to detect, but that the error control circuit 315 of the host system 305 was able to detect (e.g., if the error control circuit 315 of the host system 305 includes the DED component 320). Additionally or alternatively, the data may have been corrupted (e.g., the error may have been introduced) while being transmitted from the memory system 310 to the host system 305.

In some cases, such as if the host system 305 is in a detection mode, the host system may determine that an error exists in the data, and accordingly enter another mode, such as a safe mode. Additionally or alternatively, the host system 305 may be in or support a third mode, such as a correction mode. While in the correction mode, the host system 305 may attempt to correct the error in the data. For example, if the error control circuit 315 of the host system 305 includes the DED component 320, the host system 305 may be configured to determine whether the error is an odd-bit error, such as a SBE, or an even-bit error, such as a DBE. In cases where the host system 305 determines that the data includes a SBE, the host system may perform an error correction operation such as SEC to correct the error. Subsequently, the host system 305 may determine that the data no longer contains the error, and may thus use the data, for example as part of executing a program or other operation which requested the data from the memory system 310.

In some cases, the output of the syndrome check circuit 335 may be the fourth data condition 355 (e.g., the "high-high" state). In such cases, the host system 305, the memory system 310, or both may determine that both the memory system 310 and the host system 305 detected an error in data. Accordingly, the host system 305, the memory system 310, or both may determine that there was an odd-bit error, such as a SBE or TBE, in the data stored in the memory system 310, but that the memory system 310 was unable to correct the error (e.g., the memory system 310 instead introduced additional errors during an error correction procedure, such as through aliasing). Thus, the host system 305 may determine that an error exists in the data, and accordingly enter a safe mode.

In some examples, the host system 305 may transition from one mode to another mode, such as the detection mode to the correction mode or from the correction mode to the detection mode. For example, if the host system 305 detects or measures a change in operating conditions, such as a change in temperature or environment, or in response to a notification from a health monitoring system of the memory system 310, the host system may determine that an uncorrectable error is more likely to be introduced into data stored at the memory system 310. Accordingly, to increase the reliability of the host system 305, the host system may initiate a detection mode (e.g., may not attempt to correct error detected in data from the memory system 310).

Figure 4:
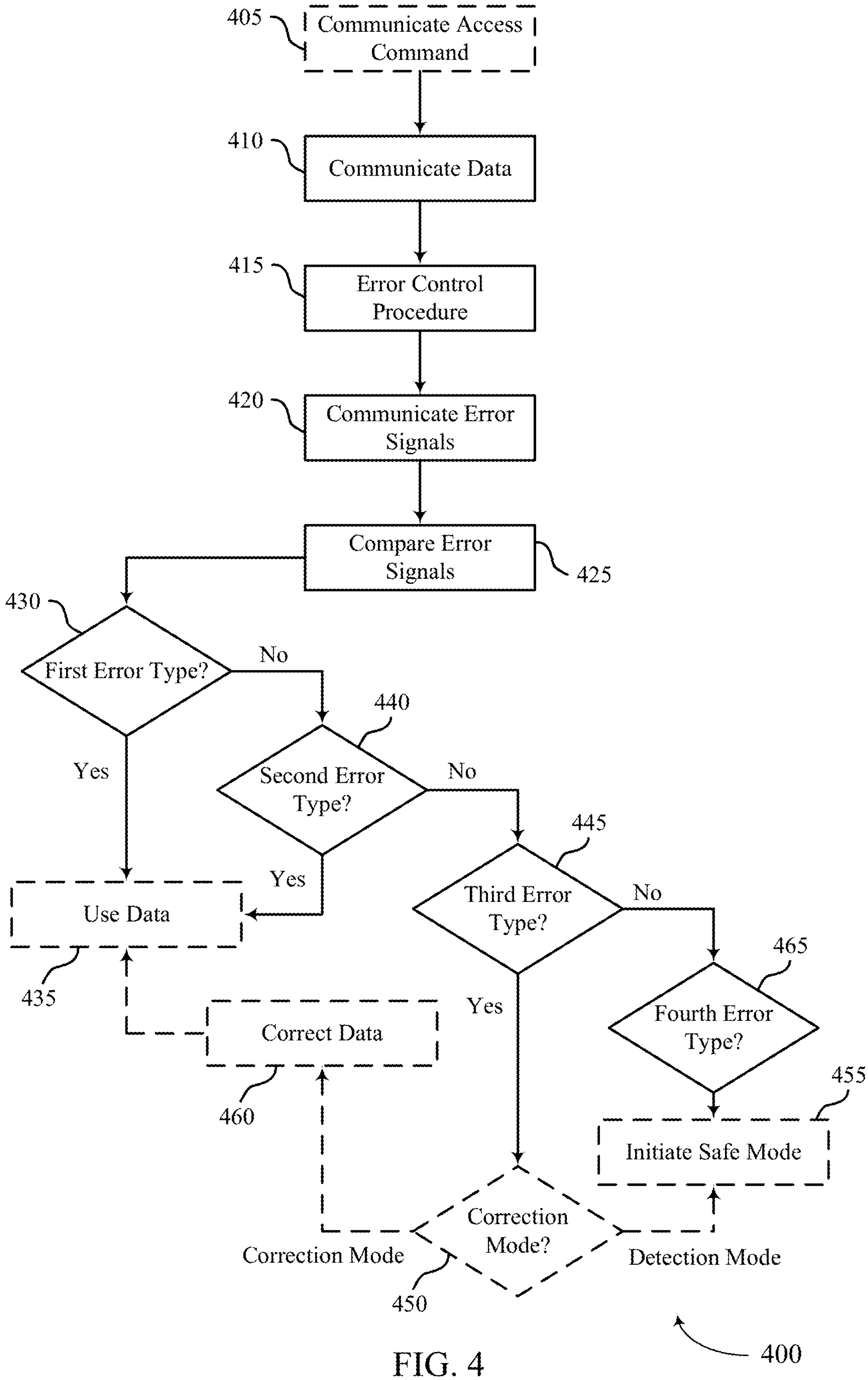
FIG. 4 illustrates an example of a process flow that supports syndrome check functionality to differentiate between error types in accordance with examples as disclosed herein.

FIG. 4 illustrates an example of a process flow 400 that supports syndrome check functionality to differentiate between error types in accordance with examples as disclosed herein. The process flow 400 may include operations performed by a host system, a memory system, and a syndrome check device, which may be examples of the corresponding systems and devices as described with reference to FIGS. 1, 2, and 3. In the following description of the process flow 400, the operations may be performed in a different order than the order shown. For example, specific operations may also be left out of the process flow 400, or other operations may be added to process flow 400.

In some examples, the process flow 400 may include communicating an access command for data. For example, at 405, host system may transmit an access command, such as a read command or a write command, to the memory system. In some cases, as part of communicating the access command, the host system, the memory system, or both may generate an error control code or other plurality of bits supporting error control using an error control procedure and store the error control code.

In some examples, the process flow 400 may include communicating data. For example, at 410, the memory system may transmit data associated with the access command (e.g., read data) to the host system. Accordingly, at 415, the host system and the memory system may perform an error control procedure to detect an error in the data, correct an error in the data, or both. For example, host system, the memory system, or both may perform an error control procedure (e.g., with an error control circuit 315, as described with reference to FIG. 3) using an error control code generated in response to the access command and an error control code stored as part of an initial write operation for the data (e.g., in response to a prior access command). In some cases, the error control procedure may include an attempt to correct a detected error. For example, if the memory system detects an error in the data, the memory system may perform an SEC procedure to correct the data. In some cases, the error control procedure may include detecting multiple error in the data. For example, the host system may perform a DED procedure and generate a bit using the DED component (e.g., a DED bit) indicating whether a DBE was detected in the data.

In some cases, the memory system, the host system, or both may generate an output or error signal indicating whether an error was detected as part of the error control procedure at 415. For example, the memory system may generate a first error signal and the host system may generate a second error signal. Accordingly, at 420, the error signals may be communicated. For example, the memory system and the host system may transmit respective error signals to a syndrome check circuit, such as the syndrome check circuit 335 as described in reference to FIG. 3.

In some examples, the process flow 400 may include comparing the first error signal and the second error signal to a threshold. For example, at 425, the syndrome check circuit may compare each error signal to a threshold to determine whether the first error signal is high (e.g., a logic "1") or low (e.g., a logic "0") and to determine whether the second error signal is high or low. Accordingly, the syndrome check circuit may generate an output indicating the combination of the first error signal and the second error signal. In some cases, the combination may be referred to as a data condition, which may include a first data condition (e.g., if the first error signal is low and the second error signal is low), a second data condition (e.g., if the first error signal is low and the second error signal is high), a third data condition (e.g., if the first error signal is high and the second error signal is low), or a fourth data condition (e.g., if the first error signal is high and the second error signal is high).

In some cases, the process flow 400 may include determining whether the combination of the first error signal and the second error signal is the first type. For example, at 430, the syndrome check circuit may determine that neither the memory system nor the host system detected an error. In such cases, the memory system, the host system, or both may determine that the data is good or "prime" (e.g., the data may not contain an error). Accordingly, the memory system, the host system, or both may, at 435, use the data, for example as part of the access operation (e.g., the memory system may store the data or the host system may use the data as part of executing a program or other operation associated with the data).

In some cases, the process flow 400 may include determining whether the combination of the first error signal and the second error signal is the second type. For example, at 440, the syndrome check circuit may determine that the memory system detected an error and that the host system did not detect an error. In such cases, the memory system, the host system, or both may determine that the memory system detected a SBE in the data, and that the memory system corrected the SBE using an error correction procedure, such as an SEC procedure. Accordingly, the memory system, the host system, or both may, at 435, use the data. Additionally or alternatively, in response to detecting the second data condition, the memory system, the host system, or both may correct a latent error associated with a memory cell storing the data, for example as described with reference to FIG. 3.

In some cases, the process flow 400 may include determining whether the combination of the first error signal and the second error signal is the third type. For example, at 445, the syndrome check circuit may determine that the memory system did not detect an error and that the host system detected an error. Accordingly, the host system, the memory system, or both may determine that there was a MBE, such as a DBE in the data stored in the memory system which the error control circuit of the memory system was unable to detect, but that the error control circuit of the host system was able to detect Additionally or alternatively, the data may have been corrupted (e.g., the error may have been introduced) while being transmitted from the memory system to the host system.

In some cases, such as if the host system is in a detection mode at 450, the host system may determine that an error exists in the data, and accordingly, at 455, enter a safe mode. Additionally or alternatively, the host system may be in or support a correction mode at 450. While in the correction mode, the host system may, at 460, attempt to correct the error in the data. Subsequently, the host system may determine that the data no longer contains the error, and may, at 435, use the data.

In some cases, the process flow 400 may include determining whether the combination of the first error signal and the second error signal is the fourth type. For example, at 465, the syndrome check circuit may determine that both the memory system and the host system detected an error. Accordingly, the host system, the memory system, or both may determine that there was an odd-bit error, such as a SBE or TBE, in the data stored in the memory system, but that the memory system was unable to correct the error (e.g., the memory system instead introduced additional errors during an error correction procedure, such as through aliasing). Thus, the host system may determine that an error exists in the data, and accordingly, at 455, enter a safe mode.

Aspects of the process flow 400 may be implemented by a controller (e.g., logic), among other components. Additionally or alternatively, aspects of the process flow 400 may be implemented as instructions stored in memory (e.g., firmware stored in a memory coupled with the memory system or with the host system). For example, the instructions, when executed by a controller (e.g., the external memory controller 120 or the device memory controller 155, as described with reference to FIG. 1), may cause the controller to perform the operations of the process flow 400.

Figure 5:
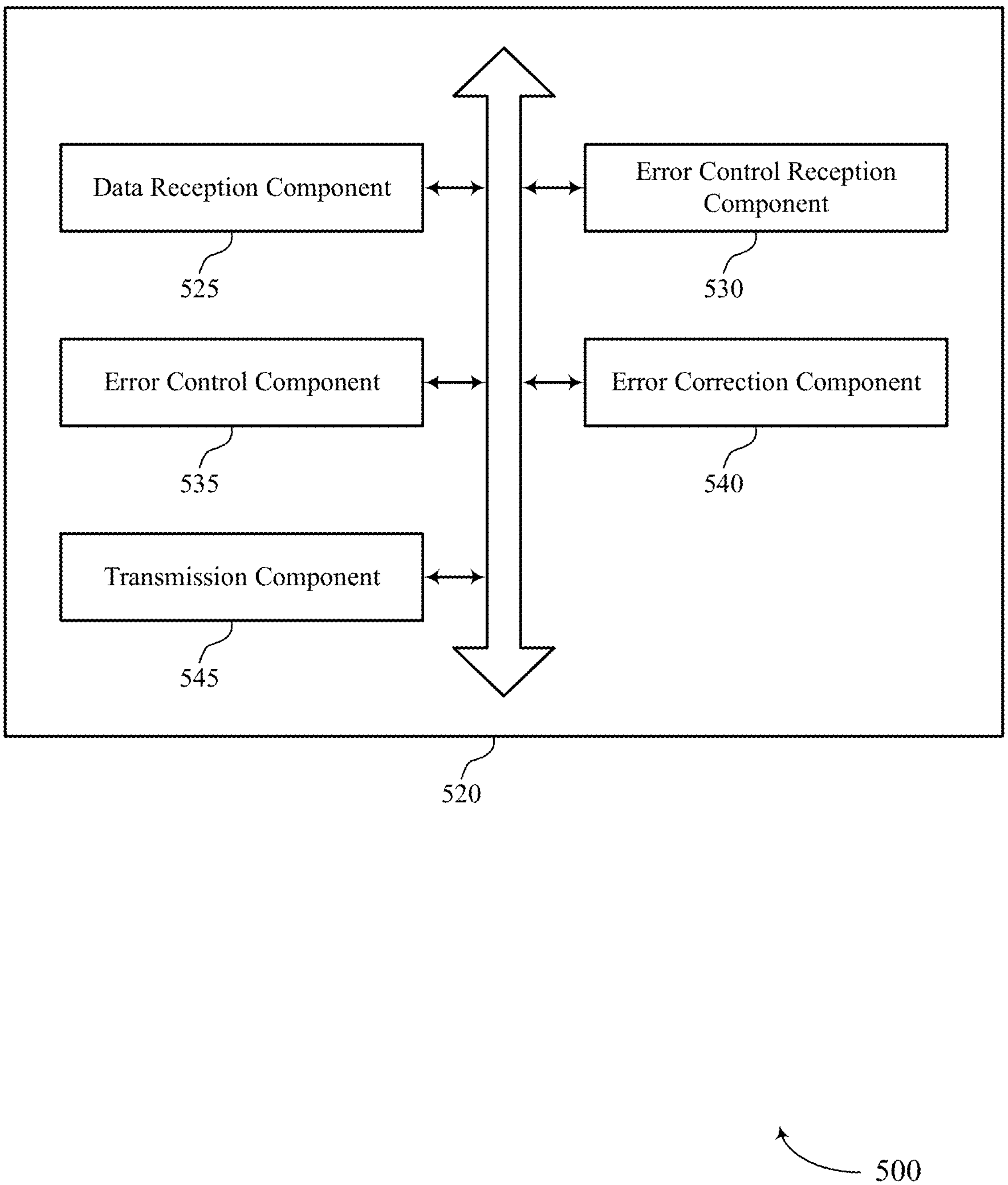
FIG. 5 shows a block diagram of a host device that supports syndrome check functionality to differentiate between error types in accordance with examples as disclosed herein.

FIG. 5 shows a block diagram 500 of a host device 520 that supports syndrome check functionality to differentiate between error types in accordance with examples as disclosed herein. The host device 520 may be an example of aspects of a host device as described with reference to FIGS. 1 through 4. The host device 520, or various components thereof, may be an example of means for performing various aspects of syndrome check functionality to differentiate between error types as described herein. For example, the host device 520 may include a data reception component 525, an error control reception component 530, an error control component 535, an error correction component 540, a transmission component 545, or any combination thereof. Each of these components may communicate, directly or indirectly, with one another (e.g., via one or more buses).

The data reception component 525 may be configured as or otherwise support a means for receiving, from a memory device, a first signal indicative of data. The error control reception component 530 may be configured as or otherwise support a means for receiving, from the memory device, a second signal with a first signal level indicative of whether the memory device detected a first error associated with the data. The error control component 535 may be configured as or otherwise support a means for performing, at a host device, a procedure for error control on the data based at least in part on a plurality of bits supporting error control for the data, the procedure for error control including outputting a third signal with a second signal level indicative of whether the host device detected a second error associated with the data. The error correction component 540 may be configured as or otherwise support a means for performing an operation for correcting the data based at least in part on the first signal level, the second signal level, and the procedure for error control.

In some examples, the error control component 535 may be configured as or otherwise support a means for generating, at the host device, a fourth signal indicative of DED for the data, where the second signal level is further based at least in part on the fourth signal.

In some examples, the error control component 535 may be configured as or otherwise support a means for comparing the first signal level to a threshold associated with error detection. In some examples, the error control component 535 may be configured as or otherwise support a means for comparing the second signal level to the threshold, where performing the operation for correcting the data is based at least in part on comparing the first signal level to the threshold and comparing the second signal level to the threshold.

In some examples, the error control component 535 may be configured as or otherwise support a means for determining that the memory device detected the first error based at least in part on the first signal level satisfying the threshold and that the host device did not detect the second error based at least in part on the second signal level failing to satisfy the threshold, where performing the operation for correcting the data is based at least in part on the determining.

In some examples, the error control component 535 may be configured as or otherwise support a means for determining that the memory device did not detect the first error based at least in part on the first signal level failing to satisfy the threshold and that the host device detected the second error based at least in part on the second signal level satisfying the threshold, where performing the operation for correcting the data is based at least in part on the determining.

In some examples, the error control component 535 may be configured as or otherwise support a means for determining that the memory device detected the first error based at least in part on the first signal level satisfying the threshold and that the host device detected the second error based at least in part on the second signal level satisfying the threshold, where performing the operation for correcting the data is based at least in part on the determining.

In some examples, the error control component 535 may be configured as or otherwise support a means for detecting a single-bit error from the memory device, a multi-bit error from the memory device, a single-bit error at the host device, or a multi-bit error at the host device, or any combination thereof based at least in part on comparing the first signal level to the threshold and comparing the second signal level to the threshold, where performing the operation for correcting the data is based at least in part on the detecting.

In some examples, the data reception component 525 may be configured as or otherwise support a means for receiving, from the memory device, a fourth signal indicative of second data. In some examples, the error control reception component 530 may be configured as or otherwise support a means for receiving, from the memory device, a fifth signal with a third signal level indicative of whether the memory device detected a third error associated with the second data. In some examples, the error control component 535 may be configured as or otherwise support a means for performing, at the host device, a second procedure for error control on the second data, the second procedure for error control including outputting a sixth signal with a fourth signal level indicative of whether the host device detected a fourth error associated with the second data. In some examples, the error control component 535 may be configured as or otherwise support a means for comparing the third signal level to a threshold associated with error detection. In some examples, the error control component 535 may be configured as or otherwise support a means for comparing the fourth signal level to the threshold. In some examples, the error control component 535 may be configured as or otherwise support a means for determining that the memory device did not detect the third error based at least in part on the third signal level failing to satisfy the threshold and that the host device did not detect the fourth error based at least in part on the fourth signal level failing to satisfy the threshold, where the host device refrains from performing a second operation for correcting the second data based at least in part on the determining.

In some examples, the transmission component 545 may be configured as or otherwise support a means for transmitting, to the memory device, a fourth signal indicative of a command to read the data, where receiving the first signal is based at least in part on the command to read the data.

In some examples, the transmission component 545 may be configured as or otherwise support a means for transmitting, to the memory device, a fourth signal indicative of a command to write the data to the memory device. In some examples, the error control component 535 may be configured as or otherwise support a means for initiating a writing of the plurality of bits supporting error control for the data to the host device based at least in part on the command to write the data to the memory device.

In some examples, the error control component 535 may be configured as or otherwise support a means for generating, for the data, a second plurality of bits supporting error control for the data in response to receiving the first signal from the memory device. In some examples, the error control component 535 may be configured as or otherwise support a means for comparing the second plurality of bits to the plurality of bits, where the third signal is further based at least in part on the comparing.

In some examples, the error control component 535 may be configured as or otherwise support a means for writing, to the host device, a first plurality of syndromes based at least in part on the data, the first plurality of syndromes associated with the procedure for error control for the data, each syndrome of the first plurality of syndromes including error correction or error detection syndrome bits, where the first plurality of syndromes includes the plurality of bits supporting error control for the data. In some examples, the error control component 535 may be configured as or otherwise support a means for generating, at the host device, a second plurality of syndromes based at least in part on receiving the first signal indicative of the data, the second plurality of syndromes associated with the procedure for error control for the data, each syndrome of the second plurality of syndromes including error correction or error detection syndrome bits. In some examples, the error control component 535 may be configured as or otherwise support a means for determining whether the first plurality of syndromes matches the second plurality of syndromes based at least in part on comparing the first plurality of syndromes and the second plurality of syndromes, where performing the operation for correcting the data is based at least in part on determining whether the first plurality of syndromes matches the second plurality of syndromes.

Figure 6:
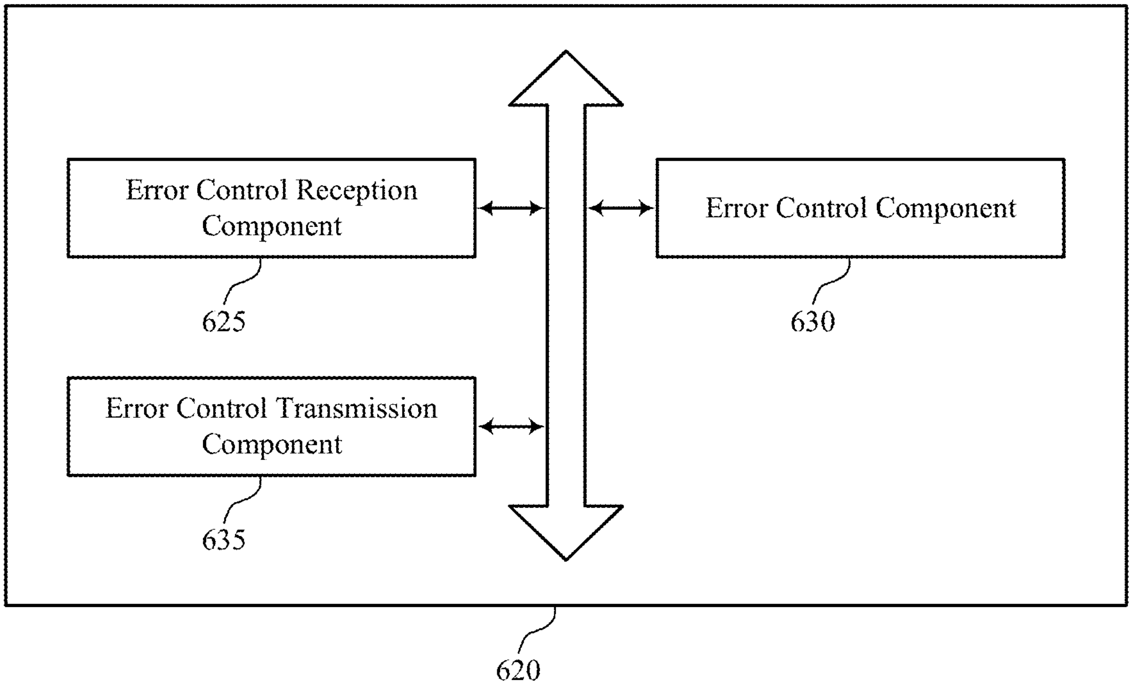
FIG. 6 shows a block diagram of a syndrome check device that supports syndrome check functionality to differentiate between error types in accordance with examples as disclosed herein.

FIG. 6 shows a block diagram 600 of a syndrome check device 620 that supports syndrome check functionality to differentiate between error types in accordance with examples as disclosed herein. The syndrome check device 620 may be an example of aspects of a syndrome check device as described with reference to FIGS. 1 through 4. The syndrome check device 620, or various components thereof, may be an example of means for performing various aspects of syndrome check functionality to differentiate between error types as described herein. For example, the syndrome check device 620 may include an error control reception component 625, an error control component 630, an error control transmission component 635, or any combination thereof. Each of these components may communicate, directly or indirectly, with one another (e.g., via one or more buses).

The error control reception component 625 may be configured as or otherwise support a means for receiving a first signal with a first signal level indicative of whether a memory device detected a first error associated with data. In some examples, the error control reception component 625 may be configured as or otherwise support a means for receiving a second signal with a second signal level indicative of whether a host device detected a second error associated with the data. The error control component 630 may be configured as or otherwise support a means for comparing the first signal level and the second signal each to a threshold associated with error detection. The error control transmission component 635 may be configured as or otherwise support a means for outputting a third signal indicative of a type of error associated with the data based at least in part on comparing the first signal level to the threshold and the second signal level to the threshold.

In some examples, the error control component 630 may be configured as or otherwise support a means for determining that the memory device did not detect the first error based at least in part on the first signal level failing to satisfy the threshold and that the host device did not detect the second error based at least in part on the second signal level failing to satisfy the threshold, where the third signal indicative of the type of error associated with the data indicates that the data, a first plurality of bits supporting error control for the data at the memory device, and a second plurality of bits supporting error control for the data at the host device do not have an error at the memory device or at the host device.

In some examples, the error control component 630 may be configured as or otherwise support a means for determining that the memory device detected the first error based at least in part on the first signal level satisfying the threshold and that the host device did not detect the second error based at least in part on the second signal level failing to satisfy the threshold, where the third signal indicative of the type of error associated with the data indicates that the data or a first plurality of bits supporting error control for the data at the memory device has a single-bit error at the memory device.

In some examples, the error control component 630 may be configured as or otherwise support a means for determining that the memory device did not detect the first error based at least in part on the first signal level failing to satisfy the threshold and that the host device detected the second error based at least in part on the second signal level satisfying the threshold, where the third signal indicative of the type of error associated with the data indicates that the data, or a first plurality of bits supporting error control for the data at the memory device, or both have a multi-bit error at the memory device, or the data, or a second plurality of bits supporting error control for the data at the host device, or both have a single-bit or multi-bit error at the host device, or any combination thereof.

In some examples, the error control component 630 may be configured as or otherwise support a means for determining that the memory device detected the first error based at least in part on the first signal level satisfying the threshold and that the host device detected the second error based at least in part on the second signal level satisfying the threshold, where the third signal indicative of the type of error associated with the data indicates that the data, or a first plurality of bits supporting error control for the data at the memory device, or both have a multi-bit error at the memory device.

Figure 7:
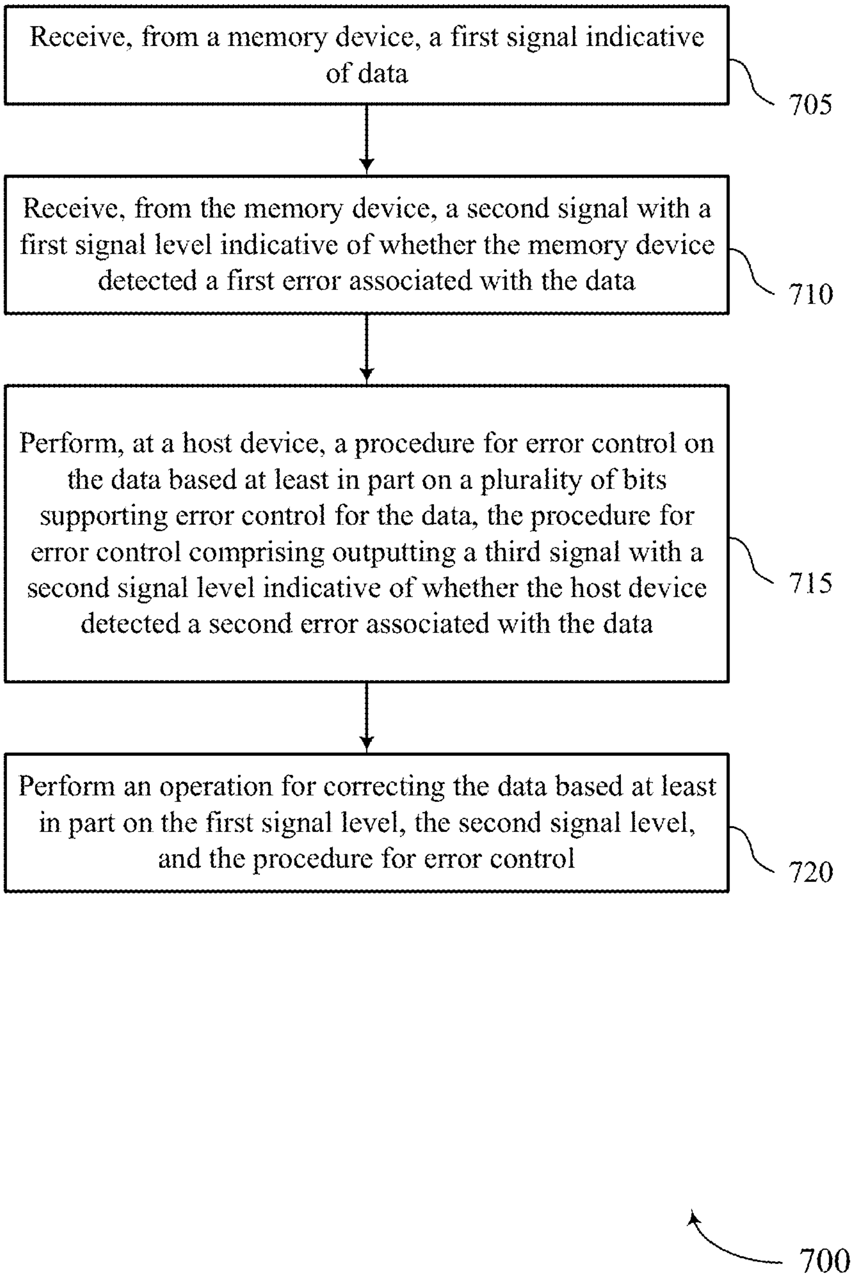
FIGS. 7 and 8 show flowcharts illustrating a method or methods that support syndrome check functionality to differentiate between error types in accordance with examples as disclosed herein.

FIG. 7 shows a flowchart illustrating a method 700 that supports syndrome check functionality to differentiate between error types in accordance with examples as disclosed herein. The operations of method 700 may be implemented by a host device or its components as described herein. For example, the operations of method 700 may be performed by a host device as described with reference to FIGS. 1 through 5. In some examples, a host device may execute a set of instructions to control the functional elements of the device to perform the described functions. Additionally or alternatively, the host device may perform aspects of the described functions using special-purpose hardware.

At 705, the method may include receiving, from a memory device, a first signal indicative of data. The operations of 705 may be performed in accordance with examples as disclosed with reference to FIGS. 3 and 4. In some examples, aspects of the operations of 705 may be performed by a data reception component 525 as described with reference to FIG. 5.

At 710, the method may include receiving, from the memory device, a second signal with a first signal level indicative of whether the memory device detected a first error associated with the data. The operations of 710 may be performed in accordance with examples as disclosed with reference to FIGS. 3 and 4. In some examples, aspects of the operations of 710 may be performed by an error control reception component 530 as described with reference to FIG. 5.

At 715, the method may include performing, at a host device, a procedure for error control on the data based at least in part on a plurality of bits supporting error control for the data, the procedure for error control including outputting a third signal with a second signal level indicative of whether the host device detected a second error associated with the data. The operations of 715 may be performed in accordance with examples as disclosed with reference to FIGS. 3 and 4. In some examples, aspects of the operations of 715 may be performed by an error control component 535 as described with reference to FIG. 5.

At 720, the method may include performing an operation for correcting the data based at least in part on the first signal level, the second signal level, and the procedure for error control. The operations of 720 may be performed in accordance with examples as disclosed with reference to FIGS. 3 and 4. In some examples, aspects of the operations of 720 may be performed by an error correction component 540 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for receiving, from a memory device, a first signal indicative of data; receiving, from the memory device, a second signal with a first signal level indicative of whether the memory device detected a first error associated with the data; performing, at a host device, a procedure for error control on the data based at least in part on a plurality of bits supporting error control for the data, the procedure for error control including outputting a third signal with a second signal level indicative of whether the host device detected a second error associated with the data; and performing an operation for correcting the data based at least in part on the first signal level, the second signal level, and the procedure for error control.

Aspect 2: The apparatus of aspect 1, further including operations, features, circuitry, logic, means, or instructions, or any combination thereof for generating, at the host device, a fourth signal indicative of DED for the data, where the second signal level is further based at least in part on the fourth signal.

Aspect 3: The apparatus of any of aspects 1 through 2, further including operations, features, circuitry, logic, means, or instructions, or any combination thereof for comparing the first signal level to a threshold associated with error detection and comparing the second signal level to the threshold, where performing the operation for correcting the data is based at least in part on comparing the first signal level to the threshold and comparing the second signal level to the threshold.

Aspect 4: The apparatus of aspect 3, further including operations, features, circuitry, logic, means, or instructions, or any combination thereof for determining that the memory device detected the first error based at least in part on the first signal level satisfying the threshold and that the host device did not detect the second error based at least in part on the second signal level failing to satisfy the threshold, where performing the operation for correcting the data is based at least in part on the determining.

Aspect 5: The apparatus of any of aspects 3 through 4, further including operations, features, circuitry, logic, means, or instructions, or any combination thereof for determining that the memory device did not detect the first error based at least in part on the first signal level failing to satisfy the threshold and that the host device detected the second error based at least in part on the second signal level satisfying the threshold, where performing the operation for correcting the data is based at least in part on the determining.

Aspect 6: The apparatus of any of aspects 3 through 5, further including operations, features, circuitry, logic, means, or instructions, or any combination thereof for determining that the memory device detected the first error based at least in part on the first signal level satisfying the threshold and that the host device detected the second error based at least in part on the second signal level satisfying the threshold, where performing the operation for correcting the data is based at least in part on the determining.

Aspect 7: The apparatus of any of aspects 3 through 6, further including operations, features, circuitry, logic, means, or instructions, or any combination thereof for detecting a single-bit error from the memory device, a multi-bit error from the memory device, a single-bit error at the host device, or a multi-bit error at the host device, or any combination thereof based at least in part on comparing the first signal level to the threshold and comparing the second signal level to the threshold, where performing the operation for correcting the data is based at least in part on the detecting.

Aspect 8: The apparatus of any of aspects 1 through 7, further including operations, features, circuitry, logic, means, or instructions, or any combination thereof for receiving, from the memory device, a fourth signal indicative of second data; receiving, from the memory device, a fifth signal with a third signal level indicative of whether the memory device detected a third error associated with the second data; performing, at the host device, a second procedure for error control on the second data, the second procedure for error control including outputting a sixth signal with a fourth signal level indicative of whether the host device detected a fourth error associated with the second data; comparing the third signal level to a threshold associated with error detection; comparing the fourth signal level to the threshold; and determining that the memory device did not detect the third error based at least in part on the third signal level failing to satisfy the threshold and that the host device did not detect the fourth error based at least in part on the fourth signal level failing to satisfy the threshold, where the host device refrains from performing a second operation for correcting the second data based at least in part on the determining.

Aspect 9: The apparatus of any of aspects 1 through 8, further including operations, features, circuitry, logic, means, or instructions, or any combination thereof for transmitting, to the memory device, a fourth signal indicative of a command to read the data, where receiving the first signal is based at least in part on the command to read the data.

Aspect 10: The apparatus of any of aspects 1 through 9, further including operations, features, circuitry, logic, means, or instructions, or any combination thereof for transmitting, to the memory device, a fourth signal indicative of a command to write the data to the memory device and initiating a writing of the plurality of bits supporting error control for the data to the host device based at least in part on the command to write the data to the memory device.

Aspect 11: The apparatus of aspect 10, further including operations, features, circuitry, logic, means, or instructions, or any combination thereof for generating, for the data, a second plurality of bits supporting error control for the data in response to receiving the first signal from the memory device and comparing the second plurality of bits to the plurality of bits, where the third signal is further based at least in part on the comparing.

Aspect 12: The apparatus of any of aspects 1 through 11, further including operations, features, circuitry, logic, means, or instructions, or any combination thereof for writing, to the host device, a first plurality of syndromes based at least in part on the data, the first plurality of syndromes associated with the procedure for error control for the data, each syndrome of the first plurality of syndromes including error correction or error detection syndrome bits, where the first plurality of syndromes includes the plurality of bits supporting error control for the data; generating, at the host device, a second plurality of syndromes based at least in part on receiving the first signal indicative of the data, the second plurality of syndromes associated with the procedure for error control for the data, each syndrome of the second plurality of syndromes including error correction or error detection syndrome bits; and determining whether the first plurality of syndromes matches the second plurality of syndromes based at least in part on comparing the first plurality of syndromes and the second plurality of syndromes, where performing the operation for correcting the data is based at least in part on determining whether the first plurality of syndromes matches the second plurality of syndromes.

Figure 8:
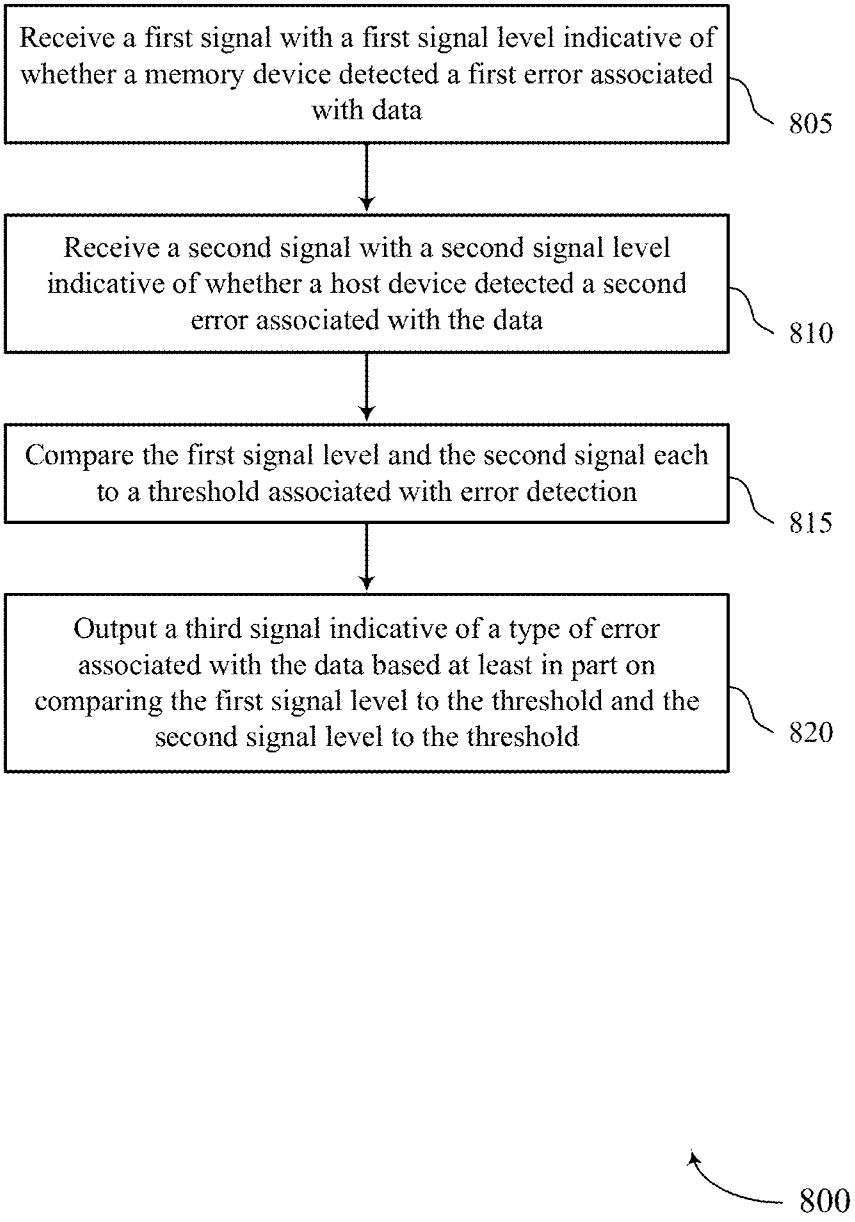

FIG. 8 shows a flowchart illustrating a method 800 that supports syndrome check functionality to differentiate between error types in accordance with examples as disclosed herein. The operations of method 800 may be implemented by a syndrome check device or its components as described herein. For example, the operations of method 800 may be performed by a syndrome check device as described with reference to FIGS. 1 through 4 and 6. In some examples, a syndrome check device may execute a set of instructions to control the functional elements of the device to perform the described functions. Additionally or alternatively, the syndrome check device may perform aspects of the described functions using special-purpose hardware.

At 805, the method may include receiving a first signal with a first signal level indicative of whether a memory device detected a first error associated with data. The operations of 805 may be performed in accordance with examples as disclosed with reference to FIGS. 3 and 4. In some examples, aspects of the operations of 805 may be performed by an error control reception component 625 as described with reference to FIG. 6.

At 810, the method may include receiving a second signal with a second signal level indicative of whether a host device detected a second error associated with the data. The operations of 810 may be performed in accordance with examples as disclosed with reference to FIGS. 3 and 4. In some examples, aspects of the operations of 810 may be performed by an error control reception component 625 as described with reference to FIG. 6.

At 815, the method may include comparing the first signal level and the second signal each to a threshold associated with error detection. The operations of 815 may be performed in accordance with examples as disclosed with reference to FIGS. 3 and 4. In some examples, aspects of the operations of 815 may be performed by an error control component 630 as described with reference to FIG. 6.

At 820, the method may include outputting a third signal indicative of a type of error associated with the data based at least in part on comparing the first signal level to the threshold and the second signal level to the threshold. The operations of 820 may be performed in accordance with examples as disclosed with reference to FIGS. 3 and 4. In some examples, aspects of the operations of 820 may be performed by an error control transmission component 635 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor), or any combination thereof for performing the following aspects of the present disclosure:

Aspect 13: The apparatus, including features, circuitry, logic, means, or instructions, or any combination thereof for receiving a first signal with a first signal level indicative of whether a memory device detected a first error associated with data; receiving a second signal with a second signal level indicative of whether a host device detected a second error associated with the data; comparing the first signal level and the second signal each to a threshold associated with error detection; and outputting a third signal indicative of a type of error associated with the data based at least in part on comparing the first signal level to the threshold and the second signal level to the threshold.

Aspect 14: The apparatus of aspect 13, further including operations, features, circuitry, logic, means, or instructions, or any combination thereof for determining that the memory device did not detect the first error based at least in part on the first signal level failing to satisfy the threshold and that the host device did not detect the second error based at least in part on the second signal level failing to satisfy the threshold, where the third signal indicative of the type of error associated with the data indicates that the data, a first plurality of bits supporting error control for the data at the memory device, and a second plurality of bits supporting error control for the data at the host device do not have an error at the memory device or at the host device.

Aspect 15: The apparatus of any of aspects 13 through 14, further including operations, features, circuitry, logic, means, or instructions, or any combination thereof for determining that the memory device detected the first error based at least in part on the first signal level satisfying the threshold and that the host device did not detect the second error based at least in part on the second signal level failing to satisfy the threshold, where the third signal indicative of the type of error associated with the data indicates that the data or a first plurality of bits supporting error control for the data at the memory device has a single-bit error at the memory device.

Aspect 16: The apparatus of any of aspects 13 through 15, further including operations, features, circuitry, logic, means, or instructions, or any combination thereof for determining that the memory device did not detect the first error based at least in part on the first signal level failing to satisfy the threshold and that the host device detected the second error based at least in part on the second signal level satisfying the threshold, where the third signal indicative of the type of error associated with the data indicates that the data, or a first plurality of bits supporting error control for the data at the memory device, or both have a multi-bit error at the memory device, or the data, or a second plurality of bits supporting error control for the data at the host device, or both have a single-bit or multi-bit error at the host device, or any combination thereof.

Aspect 17: The apparatus of any of aspects 13 through 16, further including operations, features, circuitry, logic, means, or instructions, or any combination thereof for determining that the memory device detected the first error based at least in part on the first signal level satisfying the threshold and that the host device detected the second error based at least in part on the second signal level satisfying the threshold, where the third signal indicative of the type of error associated with the data indicates that the data, or a first plurality of bits supporting error control for the data at the memory device, or both have a multi-bit error at the memory device.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 18: An apparatus, including: first circuitry operable to receive a first signal with a first signal level indicative of whether a memory device detected a first error associated with data received at the apparatus; second circuitry operable to perform a procedure for error control on the data and to output a second signal with a second signal level indicative of whether the second circuitry detected a second error associated with the data; and a plurality of logic gates operable to compare the first signal level to the second signal level, an inverse of the first signal level to the second signal level, the first signal level to an inverse of the second signal level, and the inverse of the first signal level to the inverse of the second signal level.

Aspect 19: The apparatus of aspect 18, further including: a register operable to store data representative of one or more outputs from the plurality of logic gates.

Aspect 20: The apparatus of aspect 19, where the one or more outputs indicate a type of error associated with the data.

Aspect 21: The apparatus of any of aspects 18 through 20, further including: third circuitry operable to perform a procedure for DED, the third circuitry further operable to output a third signal indicative of a DED bit based at least in part on the procedure for DED, where the second signal level is further based at least in part on the DED bit.

Aspect 22: The apparatus of any of aspects 18 through 21, further including: a plurality of second logic gates, each second logic gate of the plurality of second logic gates operable to compare a first bit of a first plurality of bits supporting error control for the data with a second bit of a second plurality of bits supporting error control for the data, where the procedure for error control on the data is based at least in part on a plurality of outputs of the plurality of second logic gates.

Aspect 23: The apparatus of aspect 22, further including: a plurality of third logic gates coupled with the plurality of second logic gates, the plurality of third logic gates operable to compare a first output of the plurality of outputs from the plurality of second logic gates with a second output of the plurality of outputs from the plurality of second logic gates, where the second signal level is based at least in part on an output of the plurality of third logic gates.

An apparatus is described. The following provides an overview of aspects of the apparatus as described herein:

Aspect 24: An apparatus, including: a host device; and logic coupled with the host device and operable to cause the apparatus to: receive, from a memory device, a first signal indicative of data; receive, from the memory device, a second signal with a first signal level indicative of whether the memory device detected a first error associated with the data; perform, at the host device, a procedure for error control on the data based at least in part on a plurality of bits supporting error control for the data, the procedure for error control including outputting a third signal with a second signal level indicative of whether the host device detected a second error associated with the data; and perform an operation for correcting the data based at least in part on the first signal level, the second signal level, and the procedure for error control.

Aspect 25: The apparatus of aspect 24, where the logic is further operable to cause the apparatus to: generate, at the host device, a fourth signal indicative of DED for the data, where the second signal level is further based at least in part on the fourth signal.

Aspect 26: The apparatus of any of aspects 24 through 25, where the logic is further operable to cause the apparatus to: compare the first signal level to a threshold associated with error detection; and compare the second signal level to the threshold, where performing the operation for correcting the data is based at least in part on comparing the first signal level to the threshold and comparing the second signal level to the threshold.

Aspect 27: The apparatus of aspect 26, where the logic is further operable to cause the apparatus to: determine that the memory device detected the first error based at least in part on the first signal level satisfying the threshold and that the host device did not detect the second error based at least in part on the second signal level failing to satisfy the threshold, where performing the operation for correcting the data is based at least in part on the determining.

Aspect 28: The apparatus of any of aspects 26 through 27, where the logic is further operable to cause the apparatus to: determine that the memory device did not detect the first error based at least in part on the first signal level failing to satisfy the threshold and that the host device detected the second error based at least in part on the second signal level satisfying the threshold, where performing the operation for correcting the data is based at least in part on the determining.

Aspect 29: The apparatus of any of aspects 26 through 28, where the logic is further operable to cause the apparatus to: determine that the memory device detected the first error based at least in part on the first signal level satisfying the threshold and that the host device detected the second error based at least in part on the second signal level satisfying the threshold, where performing the operation for correcting the data is based at least in part on the determining.

Aspect 30: The apparatus of any of aspects 26 through 29, where the logic is further operable to cause the apparatus to: detect a single-bit error at the memory device, a multi-bit error at the memory device, a single-bit error at the host device, or a multi-bit error at the host device, or any combination thereof based at least in part on comparing the first signal level to the threshold and comparing the second signal level to the threshold, where performing the operation for correcting the data is based at least in part on the detecting.

Aspect 31: The apparatus of any of aspects 24 through 30, where the logic is further operable to cause the apparatus to: receive, from the memory device, a fourth signal indicative of second data; receive, from the memory device, a fifth signal with a third signal level indicative of whether the memory device detected a third error associated with the second data; perform, at the host device, a second procedure for error control on the second data, the second procedure for error control including outputting a sixth signal with a fourth signal level indicative of whether the host device detected a fourth error associated with the second data; compare the third signal level to a threshold associated with error detection; compare the fourth signal level to the threshold; and determine that the memory device did not detect the third error based at least in part on the third signal level failing to satisfy the threshold and that the host device did not detect the fourth error based at least in part on the fourth signal level failing to satisfy the threshold, where the host device refrains from performing a second operation for correcting the second data based at least in part on the determining.

Aspect 32: The apparatus of any of aspects 24 through 31, where the logic is further operable to cause the apparatus to: transmit, to the memory device, a fourth signal indicative of a command to read the data, where receiving the first signal is based at least in part on the command to read the data.

Aspect 33: The apparatus of any of aspects 24 through 32, where the logic is further operable to cause the apparatus to: transmit, to the memory device, a fourth signal indicative of a command to write the data to the memory device; and write the plurality of bits supporting error control for the data to the host device based at least in part on the command to write the data to the memory device.

Aspect 34: The apparatus of aspect 33, where the logic is further operable to cause the apparatus to: generate, for the data, a second plurality of bits supporting error control for the data in response to receiving the first signal from the memory device; and compare the second plurality of bits to the plurality of bits, where the third signal is further based at least in part on the comparing.

An apparatus is described. The following provides an overview of aspects of the apparatus as described herein:

Aspect 35: An apparatus, including: logic operable to cause the apparatus to: receive a first signal with a first signal level indicative of whether a memory device detected a first error associated with data; receive a second signal with a second signal level indicative of whether a host device detected a second error associated with the data; compare the first signal level the second signal level each to a threshold associated with error detection; and output a third signal indicative of a type of error associated with the data based at least in part on comparing the first signal level to the threshold and the second signal level to the threshold.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers (e.g., materials) of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:

a host system;

a memory system; and a syndrome check circuit coupled with the host system and the memory system, the syndrome check circuit operable to:

receive a first signal having a first signal level and comprising a first bit, and a second signal having a second signal level and comprising a second bit, wherein a value of the first bit indicates whether the memory system detected a first error associated with first data received by the memory system and a value of the second bit indicates whether the host system detected a second error associated with the first data; and perform an error control operation on the first data based at least in part on comparing the value of the first bit with the value of the second bit and based at least in part on comparing a level of the first signal to a level of the second signal.

2. The system of claim 1, wherein the syndrome check circuit is further operable to:

output a third signal indicating a type of error associated with the first data based at least in part on comparing the value of the first bit to the value of the second bit, and based at least in part on comparing an inverse of the level of the first signal to the level of the second signal, the level of the first signal to an inverse of the level of the second signal, and the inverse of the level of the first signal to the inverse of the level of the second signal.

3. The system of claim 2, wherein the third signal indicates that the memory system did not detect an error in the first data based at least in part on the first signal level comprising a first magnitude and that the host system did not detect an error in the first data based at least in part on the second signal level comprising a second magnitude different than the first magnitude.

4. The system of claim 2, wherein outputting the third signal further comprises:

inverting the first signal, the second signal, or both, to indicate a type of the error.

5. The system of claim 1, wherein the syndrome check circuit is further operable to:

detect a single-bit error at the memory system, a multi-bit error at the memory system, a single-bit error at the host system, or a multi-bit error at the host system, or any combination thereof based at least in part on comparing the value of the first bit with the value of the second bit and based at least in part on comparing a level of the first signal to a level of the second signal, wherein performing the error control operation is based at least in part on the detecting.

6. The system of claim 1, the syndrome check circuit further comprising:

a plurality of logic gates operable to perform the error control operation on the first data.

7. The system of claim 1, further comprising:

a register operable to store second data representative of one or more outputs from the syndrome check circuit.

8. The system of claim 1, wherein the first signal is received from the memory system and the second signal is received from the host system.

9. A method, comprising:

receiving, at a syndrome check circuit, a first signal having a first signal level and comprising a first bit, a value of the first bit indicating whether a memory system detected a first error associated with first data;

receiving, at the syndrome check circuit, a second signal having a second signal level and comprising a second bit, a value of the second bit indicating whether a host system detected a second error associated with the first data; and performing, at the syndrome check circuit, an error control operation on the first data based at least in part on comparing the value of the first bit with the value of the second bit and based at least in part on comparing a level of the first signal to a level of the second signal.

10. The method of claim 9, further comprising:

outputting a third signal indicating a type of error associated with the first data based at least in part on performing the error control operation on the first data, and based at least in part on comparing an inverse of the level of the first signal to the level of the second signal, the level of the first signal to an inverse of the level of the second signal, and the inverse of the level of the first signal to the inverse of the level of the second signal.

11. The method of claim 10, wherein the third signal indicates that the memory system did not detect an error in the first data based at least in part on the first signal level comprising a first magnitude and that the host system did not detect an error in the first data based at least in part on the second signal level comprising a second magnitude different than the first magnitude.

12. The method of claim 10, wherein outputting the third signal further comprises:

inverting the first signal, the second signal, or both, to indicate a type of the error.

13. The method of claim 9, further comprising:

detecting a single-bit error at the memory system, a multi-bit error at the memory system, a single-bit error at the host system, or a multi-bit error at the host system, or any combination thereof based at least in part on comparing the value of the first bit with the value of the second bit and based at least in part on comparing a level of the first signal to a level of the second signal, wherein performing the error control operation is based at least in part on the detecting.

14. The method of claim 9, wherein the first signal is received from the memory system and the second signal is received from the host system.

15. A non-transitory computer-readable medium storing code, the code comprising instructions executable by one or more processors to:

receive, at a syndrome check circuit, a first signal with a first signal level and comprising a first bit, a value of the first bit indicating whether a memory system detected a first error associated with first data;

receive, at the syndrome check circuit, a second signal with a second signal level and comprising a second bit, a value of the second bit indicating whether a host system detected a second error associated with the first data; and perform, at the syndrome check circuit, an error control operation on the first data based at least in part on comparing the value of the first bit with the value of the second bit and based at least in part on comparing a level of the first signal to a level of the second signal.

16. The non-transitory computer-readable medium of claim 15, wherein the instructions are further executable by the one or more processors to:

output a third signal indicating whether an error was detected in the first data based at least in part on performing the error control operation on the first data, and based at least in part on comparing an inverse of the level of the first signal to the level of the second signal, the level of the first signal to an inverse of the level of the second signal, and the inverse of the level of the first signal to the inverse of the level of the second signal.

17. The non-transitory computer-readable medium of claim 16, wherein the third signal indicates that the memory system, the host system, or both, detected an error in the first data based at least in part on the first signal level and the second signal level comprising different signal levels.

18. The non-transitory computer-readable medium of claim 16, wherein outputting the third signal further comprises:

inverting the first signal, the second signal, or both, to indicate a type of the error.

19. The non-transitory computer-readable medium of claim 15, wherein the instructions are further executable by the one or more processors to:

detect a single-bit error at the memory system, a multi-bit error at the memory system, a single-bit error at the host system, or a multi-bit error at the host system, or any combination thereof based at least in part on comparing the value of the first bit with the value of the second bit and based at least in part on comparing a level of the first signal to a level of the second signal, wherein performing the error control operation is based at least in part on the detecting.

20. The non-transitory computer-readable medium of claim 15, wherein the first signal is received from the memory system and the second signal is received from the host system.

* * * * *